United States Patent [19]
Shields

[11] Patent Number: 6,084,290
[45] Date of Patent: Jul. 4, 2000

[54] HSQ DIELECTRIC INTERLAYER

[75] Inventor: Jeffrey A. Shields, Sunnyvale, Calif.

[73] Assignee: Advanced Micro Devices, Inc., Sunnyvale, Calif.

[21] Appl. No.: 09/358,881

[22] Filed: Jul. 22, 1999

Related U.S. Application Data

[62] Division of application No. 08/992,965, Dec. 18, 1997.

[51] Int. Cl.[7] .................................................. H01L 23/58
[52] U.S. Cl. ........................... 257/632; 257/760; 257/752
[58] Field of Search .................................. 257/632, 637, 257/759, 752, 635

[56] References Cited

U.S. PATENT DOCUMENTS

| | | |
|---|---|---|
| 5,548,159 | 8/1996 | Jeng . |
| 5,607,773 | 3/1997 | Ahlburn et al. . |
| 5,665,657 | 9/1997 | Lee . |
| 5,693,566 | 12/1997 | Cheung . |
| 5,728,630 | 3/1998 | Nishimura et al. . |
| 5,888,911 | 3/1999 | Ngo et al. . |
| 5,973,387 | 10/1999 | Chen et al. . |
| 5,990,558 | 11/1999 | Tran et al. . |

FOREIGN PATENT DOCUMENTS

| | | |
|---|---|---|
| 55-9906 | 3/1980 | Japan . |
| 4255442 | 9/1992 | Japan . |

*Primary Examiner*—Sheila V. Clark

[57] ABSTRACT

The use of HSQ as a dielectric interlayer without cracking is achieved by depositing HSQ on a planarized dielectric layer, such as a silicon oxide derived from TEOS or silane. Embodiments include depositing a first HSQ gap fill layer on a patterned metal layer for gap filling leaving a non-planar upper surface. Depositing a thin layer of silicon oxide and planarizing the upper surface as by CMP, and depositing the HSQ dielectric interlayer on the planarized upper surface of the oxide layer.

11 Claims, 2 Drawing Sheets

HSQ DIELECTRIC INTERLAYER

This application is a divisional of application Ser. No. 08/992,965 filed Dec. 18, 1997.

TECHNICAL FIELD

The present invention relates to a method of manufacturing a multi-metal layer semiconductor device with reliable interconnection patterns having a low RC time constant. The invention has particular applicability in manufacturing high density multi-metal layer semiconductor devices with design features of 0.25 microns and under.

BACKGROUND ART

The escalating requirements for high densification and performance associated with ultra large scale integration semiconductor devices require design features of 0.25 microns and under, such as 0.18 microns, increased transistor and circuit speeds, high reliability and increased manufacturing throughput. The reduction of design features to 0.25 microns and under generates numerous problems challenging the limitations of conventional interconnection technology, including conventional photolithographic, etching and deposition techniques.

Conventional methodology for forming patterned metal layers comprises a subtractive etching or etch back step as the primary metal patterning technique. Such a method involves the formation of a first dielectric interlayer on a semiconductor substrate, typically doped monocrystalline silicon, with conductive contacts formed therein for electrical connection with an active region on the semiconductor substrate, such as a source/drain region. A metal layer, such as aluminum or an aluminum alloy, is deposited on the first dielectric layer, and a photoresist mask is formed on the metal layer having a pattern corresponding to a desired conductive pattern. The metal layer is then etched through the photoresist mask to form the conductive pattern comprising metal features separated by gaps, such as a plurality of metal lines with interwiring spacings therebetween. A dielectric material, such as spin on glass (SOG), is typically deposited to fill in the gaps between the metal features, and baked at a temperature of about 300° C. to about 450° C., for a period of time up to about two hours, depending upon the particular SOG material employed. Planarization, as by CMP, is then performed.

The drive to increased density and attendant shrinkage in feature size generates numerous problems. For example, as feature sizes, e.g., metal lines and interwiring spacings, shrink to 0.50 microns and below, such as 0.375 microns, it becomes increasingly difficult to satisfactorily fill in the interwiring spacings voidlessly with a dielectric material and obtain adequate step coverage.

Another problem generated by miniaturization relates to the RC time constant. Although semiconductor devices are being scaled in the horizontal dimension, they are not generally scaled in the vertical dimension, since scaling in both dimensions would lead to a higher current density that could exceed reliability limits. Horizontal scaling, therefore, requires conductive lines having a high aspect ratio, i.e., conductor height to conductor width of greater than one, with reduced interwiring spacings. As a result, capacitive coupling between conductive lines becomes a primary limitation on circuit speed. If intrametal capacitance is high, the possibility for electrical inefficiencies and inaccuracies increase. It is recognized that a reduction in capacitance within multi-level metallization systems will reduce the RC time constant between the conductive lines.

Hydrogen silsesquioxane (HSQ) offers many advantages for use in interconnect technology. HSQ is relatively carbon free, thereby rendering it unnecessary to etch back HSQ below the upper surface of the metal lines to avoid poison via problems. In addition, HSQ exhibits excellent planarity and is capable of gap filling interwiring spacings less than 0.15 microns employing conventional spin-on equipment. HSQ undergoes a melting phase at approximately 200° C.; it does not convert to the high dielectric constant glass phase until reaching temperatures of about 400° C. in intermetal applications. As deposited HSQ is considered a relatively low dielectric constant material with a dielectric constant of about 2.9–3.0, vis-à-vis silicon dioxide grown by a thermal oxidation or chemical vapor deposition which has a dielectric constant of about 3.9–4.2. The mentioned dielectric constants are based on a scale wherein 1.0 represents the dielectric constant of air.

It would be advantageous to employ HSQ as a dielectric interlayer, particularly in view of its low dielectric constant vis-à-vis conventional silicon oxide interlayers. However, in attempting to employ HSQ as a dielectric interlayer, it was found that cracking undesirably occurred, particularly in high stress areas, such as proximate leading and/or trailing conductive features of a dense array of conductive lines bordered by an open field.

For example, adverting to FIG. 1, a conductive pattern, such as a patterned metal layer comprising metal features with gaps therebetween, is formed on dielectric layer 10. The depicted patterned metal layer generally comprises a dense array of metal features including leading metal feature 11A and trailing metal feature 11B, wherein the metal features are separated by gaps 12, typically less than about 1 micron. A patterned metal layer having a feature size of about 0.50 microns typically contains gaps 12 extending about 0.375 microns. Leading metal feature 11A and trailing metal feature 11B border an open field, which generally extends greater than about 1 micron, such as greater than about 1.5 microns, e.g., greater than about 2 microns.

During experimentation conducted, a layer of HSQ was deposited on the patterned metal layer at a thickness sufficient to fill gaps 12 and serve as a dielectric interlayer, e.g., greater than about 8,000–10,000 Å. It was found, however, that cracking occurred, particularly in high stress areas wherein a stepped portion was formed, as proximate leading metal feature 11A and trailing metal feature 11B bordering an open field, indicated by arrows 14 and 15, respectively.

Cracking in dielectric interlayers creates serious problems which negatively impact production throughput and device reliability. For example, cracks serve as trapping centers for contaminant particles and cause delamination.

Accordingly, there exists a need for semiconductor technology enabling the use of HSQ as a dielectric interlayer. There also exists a need for semiconductor technology enabling the use of HSQ as a dielectric interlayer in highly integrated semiconductor devices having design features of about 0.25 microns and under.

DISCLOSURE OF THE INVENTION

An object of the present invention is a multi-metal layer semiconductor device comprising one or more HSQ dielectric interlayers.

Another object of the present invention is a method of manufacturing a multi-metal layer semiconductor device comprising at least one HSQ dielectric interlayer.

Additional objects, advantages and other features of the present invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a semiconductor device comprising: a first layer of dielectric material; a patterned conductive layer, having conductive features with gaps therebetween, formed on the first dielectric layer; a second layer of dielectric material on the patterned conductive layer filling the gaps and having a non-planar upper surface; a third layer of dielectric material, different from that of the second layer, on the non-planar upper surface of the second layer of dielectric material, the third dielectric layer having a substantially planar upper surface; and a dielectric interlayer comprising hydrogen silsesquioxane (HSQ) on the third dielectric layer.

Another aspect of the present invention is a method of manufacturing a semiconductor device, which method comprises: forming a patterned conductive layer, having conductive features with gaps therebetween, on a first layer of dielectric material; forming a second layer of dielectric material on the patterned conductive layer filling the gaps and having a non-planar upper surface; forming a third layer of dielectric material, different from the second dielectric material, on the second dielectric layer; substantially planarizing an upper surface of the third dielectric layer; and forming a dielectric interlayer of hydrogen silsesquioxane (HSQ) on the third dielectric layer.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

DESCRIPTION OF THE INVENTION

The present invention enables the use of HSQ as a dielectric interlayer in manufacturing high density, multi-metal layer semiconductor devices with reliable interconnection patterns having a low RC time constant. Advantageously, the present invention enables the use of HSQ as a dielectric interlayer without encountering the undesirable cracking problem which occurs in high stress areas when HSQ is deposited at a relatively large thickness, e.g., greater than about 8,000–10,000 Å.

It was found that the cracking problem which occurs at high stress areas of a relatively thick HSQ layer can be avoided by reducing the high stress area. In accordance with embodiments of the present invention, high stress areas of relatively thick layers of HSQ are avoided by depositing the HSQ layer on a substantially planarized surface.

Embodiments of the present invention also comprise the use of HSQ as a gap fill layer. In employing HSQ as a gap fill layer, a non-planar upper surface is formed as a result of gap filling. The non-planar upper surface of the HSQ gap fill layer contains concave portions which typically extend below the upper surface of the metal features. In accordance with the present invention, a layer of dielectric material such as an oxide, e.g., silicon oxide derived from TEOS or silane, is deposited on the dielectric gap fill layer as by plasma enhanced chemical vapor deposition (PECVD) and planarized as by etching or CMP, to provide a suitable planar surface for depositing a relatively thick HSQ dielectric interlayer without cracking. After planarizing the upper surface of the oxide layer deposited on the gap fill layer, a layer of HSQ is deposited at a suitable thickness, such as greater than about 12,000 Å, e.g., about 8,000 Å to about 17,000 Å, to form an HSQ dielectric interlayer. The upper surface of the HSQ dielectric interlayer is then planarized, as by CMP. The HSQ layers can be deposited employing a conventional spin-on technique.

Figure 2:
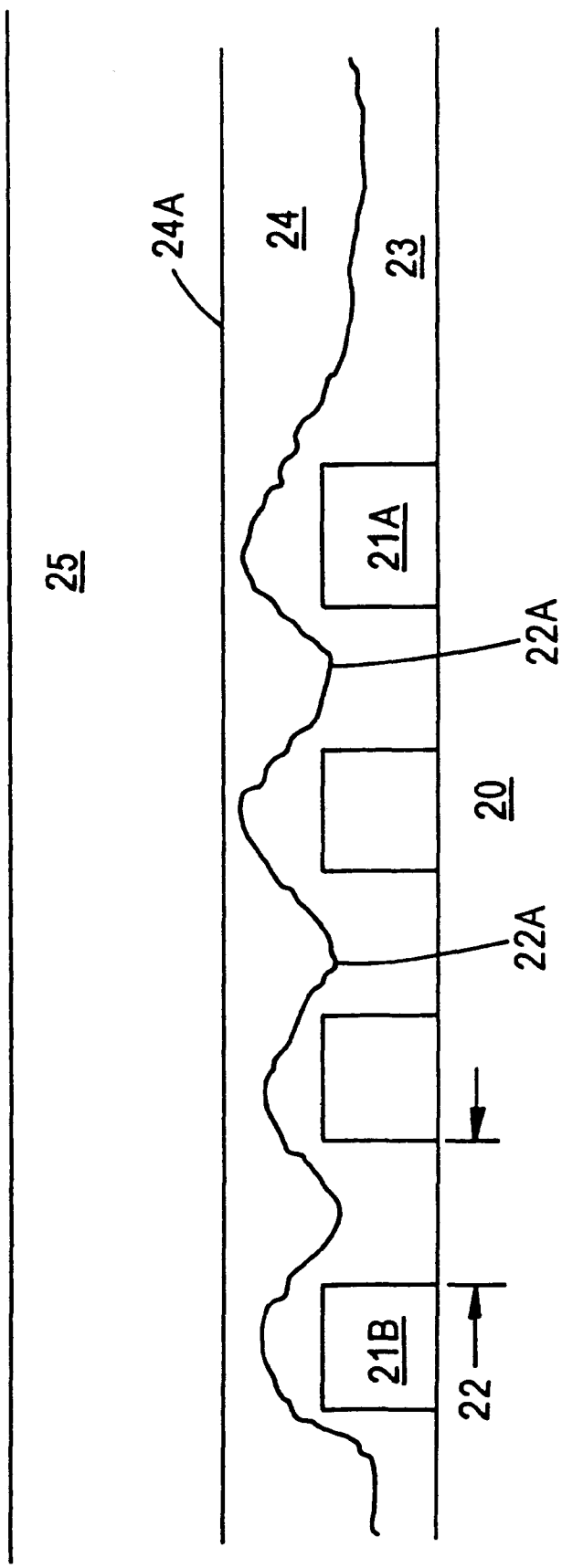
FIG. 2 illustrates an embodiment of the present invention.

An embodiment of the present invention is schematically illustrated in FIG. 2 and comprises a patterned metal layer formed on first dielectric layer 20. Patterned metal layer comprises a plurality of metal features, —including leading metal feature 21A and trailing metal feature 21B, with gaps 22 between the metal features. In forming highly integrated semiconductor devices having design features of about 0.50 microns, gaps 22 typically extend about 0.375 microns. The patterned metal layers can be formed as a conventional composite comprising a first refractory metal layer such as titanium or tungsten, an intermediate primary conductive layer such as aluminum or an aluminum alloy and an upper anti-reflective coating such as titanium nitride.

A dielectric gap fill layer 23, such as SOG or HSQ, is deposited to fill the gaps. The dielectric gap fill layer 23 typically exhibits a non-planar upper surface having concave portions 22A which extend below the upper surface of the metal features. A planarizing dielectric layer 24 is then applied, e.g., silicon oxide derived from TEOS or silane by PECVD.

Figure 1:
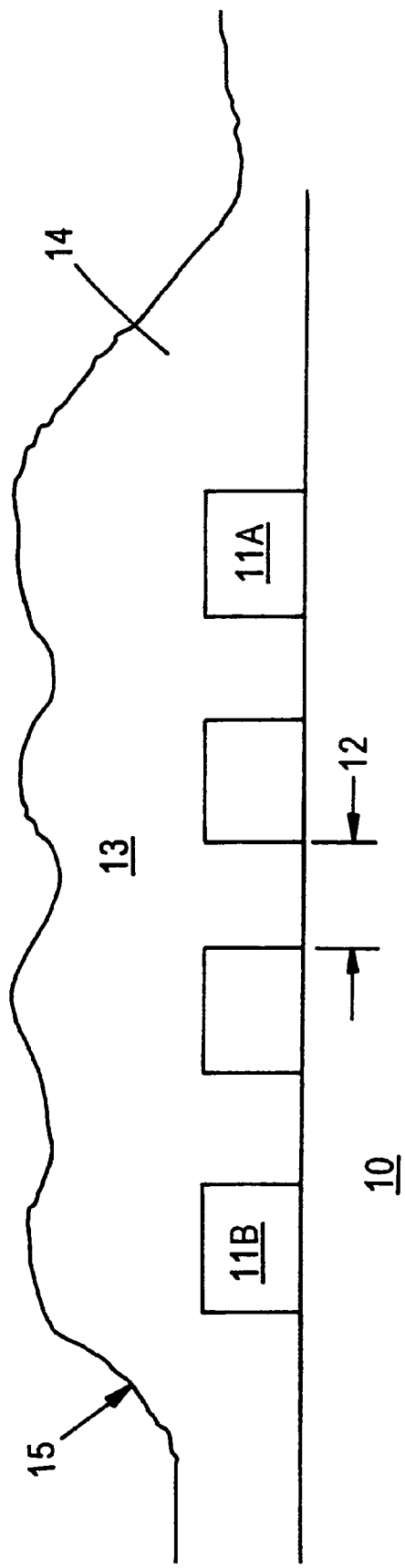
FIG. 1 schematically illustrates cracking problems attendant upon employing HSQ as a dielectric interlayer.

The upper surface of the deposited oxide 24A is then planarized, as by CMP. Having provided a planar upper surface 24A, a layer of HSQ 25 is deposited at a suitable thickness to form a dielectric interlayer, e.g., of about 8,000 Å to about 17,000 Å. As HSQ dielectric interlayer 25 is formed on a planar surface 24A, high stress areas are avoided and, hence, HSQ dielectric interlayer 25 can be formed at a relatively large thickness without encountering cracking as illustrated in FIG. 1. The upper surface of HSQ dielectric interlayer 25 can then be planarized if necessary, as by CMP, to form a substantially planar upper surface 25A. The process is then repeated by forming another patterned metal layer with metal features until a desired number of patterned metal layers are formed, e.g., about five patterned metal layers.

The present invention advantageously enables the use of a low dielectric constant material, such as HSQ, as a dielectric interlayer without cracking, thereby enabling the formation of reliable interconnection patterns having a low RC time constant. The present invention is applicable to the production of various types of semiconductor devices, particularly high density, multi-metal patterned layers with submicron features, particularly submicron features of about 0.50 microns and below, exhibiting high speed characteristics and improved reliability. The present invention is cost effective and can easily be integrated into conventional processing equipment.

In carrying out the embodiments of the present invention, the metal layers can be formed of any metal typically employed in manufacturing semiconductor devices, such as aluminum, aluminum alloys, copper, copper alloys, gold, gold alloys, silver, silver alloys, refractory metals, refractory metal alloys, and refractory metal compounds. The metal layers of the present invention can be formed by any technique conventionally employed in the manufacture of semiconductor devices. For example, the metal layers can be formed by conventional metallization techniques, such as various types of CVD processes, including low pressure chemical vapor deposition (LPCVD), and PECVD. Normally, when high melting metal point metals such as tungsten are deposited, CVD techniques are employed. Low melting point metals, such as aluminum and aluminum-base alloys, including aluminum-copper alloys, can also be deposited by melting, sputtering, or physical vapor deposition (PVD).

In the previous descriptions, numerous specific details are set forth, such as specific materials, structures, chemicals, processes, etc., in order to provide a thorough understanding of the present invention. However, the present invention can be practiced without resorting to the details specifically set forth. In other instances, well known processing structures have not been described in detail in order not to unnecessarily obscure the present invention.

Only the preferred embodiment of the invention and an example of its versatility are shown and described in the present disclosure. It is to be understood that the invention is capable of use in various other combinations and environments and is capable of changes or modifications within the scope of the inventive concept as expressed herein.

What is claimed is:

1. A semiconductor device comprising:
   a first layer of dielectric material;
   a patterned conductive layer, having conductive features with gaps therebetween, formed on the first dielectric layer;
   a second layer of dielectric material on the patterned conductive layer filling the gaps and having a non-planar upper surface;
   a third layer of dielectric material, different from that of the second layer, on the non-planar upper surface of the second layer of dielectric material, the third dielectric layer having a substantially planar upper surface; and
   a dielectric interlayer comprising hydrogen silsesquioxane (HSQ) on the third dielectric layer.

2. The semiconductor device according to claim 1, wherein the second dielectric material comprises HSQ.

3. The semiconductor device according to claim 1, wherein the HSQ dielectric interlayer has a planarized upper surface.

4. The semiconductor device according to claim 3, wherein the HSQ dielectric interlayer has a thickness of at least 12,000 Å.

5. The semiconductor device according to claim 4, wherein the HSQ dielectric interlayer has a thickness of about 12,000 Å to about 17,000 Å.

6. The semiconductor device according to claim 1, wherein the conductive features comprise an upper surface, and the non-planar upper surface of the second dielectric layer comprises concave portions extending below the upper surface of the conductive features.

7. The semiconductor device according to claim 1, wherein the patterned conductive layer is a patterned metal layer comprising metal features.

8. The semiconductor device according to claim 7, wherein the metal features have a size no greater than about 0.50 microns and the gaps extend no greater than about 0.375 microns.

9. The semiconductor device according to claim 7, wherein the metal layer is a composite comprising a first refractory metal layer, an intermediate primary conductive layer containing aluminum or an aluminum alloy, and an upper anti-reflective coating.

10. The semiconductor device according to claim 1, wherein the third dielectric material comprises an oxide.

11. The semiconductor device according to claim 10, wherein the oxide comprises silicon oxide derived from tetraethyl orthosilicate or silane by plasma enhanced chemical vapor deposition.

* * * * *